United States Patent [19]
Hsu et al.

[11] Patent Number: 6,097,056
[45] Date of Patent: Aug. 1, 2000

[54] FIELD EFFECT TRANSISTOR HAVING A FLOATING GATE

[75] Inventors: Louis L. Hsu, Fishkill; Jack A. Mandelman, Stormville; Chih-Chun Hu, Wappingers Falls, all of N.Y.

[73] Assignee: International Business Machines Corporation, Armonk, N.Y.

[21] Appl. No.: 09/067,571

[22] Filed: Apr. 28, 1998

[51] Int. Cl.[7] .................................................. H01L 27/108
[52] U.S. Cl. .............................................................. 257/315
[58] Field of Search ............................................... 257/315

[56] References Cited

U.S. PATENT DOCUMENTS

| | | | |
|---|---|---|---|
| 4,222,063 | 9/1980 | Rodgers . | |
| 4,282,540 | 8/1981 | Ning et al. . | |
| 4,613,956 | 9/1986 | Paterson et al. . | |
| 4,711,858 | 12/1987 | Harder et al. . | |
| 4,729,115 | 3/1988 | Lauffmann et al. . | |
| 4,763,177 | 8/1988 | Paterson . | |
| 4,811,078 | 3/1989 | Tigelaar et al. . | |
| 4,830,975 | 5/1989 | Bovaird et al. . | |
| 5,120,668 | 6/1992 | Hsu et al. | 437/41 |
| 5,234,535 | 8/1993 | Beyer et al. | 156/630 |
| 5,258,318 | 11/1993 | Buti et al. | 437/34 |
| 5,274,588 | 12/1993 | Manzur et al. . | |
| 5,276,338 | 1/1994 | Beyer et al. | 257/52 |
| 5,376,572 | 12/1994 | Yang et al. . | |
| 5,391,510 | 2/1995 | Hsu et al. | 437/44 |
| 5,405,795 | 4/1995 | Beyer et al. | 437/41 |
| 5,424,233 | 6/1995 | Yang et al. . | |
| 5,466,625 | 11/1995 | Hsieh et al. | 437/52 |
| 5,472,893 | 12/1995 | Iida . | |
| 5,484,738 | 1/1996 | Chu et al. | 437/33 |
| 5,501,996 | 3/1996 | Yang et al. . | |
| 5,510,630 | 4/1996 | Agarwal et al. . | |
| 5,514,890 | 5/1996 | Yang et al. . | |
| 5,521,399 | 5/1996 | Chu et al. | 257/36 |
| 5,528,062 | 6/1996 | Hsieh et al. | 257/298 |
| 5,567,533 | 10/1996 | Hsu et al. | 430/5 |
| 5,573,964 | 11/1996 | Hsu et al. | 437/40 |
| 5,599,725 | 2/1997 | Dorleans et al. | 437/40 |
| 5,610,091 | 3/1997 | Cho . | |
| 5,612,237 | 3/1997 | Ahn . | |
| 5,622,881 | 4/1997 | Acocella et al. | 438/264 |
| 5,633,522 | 5/1997 | Dorleans et al. | 257/344 |
| 5,643,813 | 7/1997 | Acocella et al. | 437/43 |
| 5,663,578 | 9/1997 | Hsu et al. | 257/66 |
| 5,675,164 | 10/1997 | Brunner et al. | 257/331 |
| 5,689,127 | 11/1997 | Chu et al. | 257/329 |
| 5,729,039 | 3/1998 | Beyer et al. | 257/347 |
| 5,736,891 | 4/1998 | Buti et al. | 327/434 |
| 5,753,525 | 5/1998 | Hsu et al. | 437/43 |
| 5,759,907 | 6/1998 | Assaderaghi et al. | 438/386 |
| 5,793,079 | 8/1998 | Georgescu et al. . | |
| 5,877,525 | 3/1999 | Ahn . | |

OTHER PUBLICATIONS

Hsu, et al., Flash Eeprom, Docket #F19–92–106, Serial #09/968,736, Filed Oct. 30, 1992.

Gambino, et al., Dual Gate SOI Transistor, Docket #F19–97–176, Serial #09/025,673, Filed Feb. 18, 1997.

Hsu, et al., An SOI Floating Body Charge Monitor Circuit and Method, Docket #F19–97–162, Serial #09/035,407, Filed Mar. 5, 1998.

*Primary Examiner*—Stephen D. Meier
*Attorney, Agent, or Firm*—Pollock, Vande Sande & Amernick; Joseph P. Abate

[57] ABSTRACT

A field effect transistor which comprises a semiconductor substrate having a source region and a drain region separated by a channel region; a conductive floating gate formed over a first portion of the channel region adjacent to the doped source region and recessed into the semiconductor substrate; and being separated from the first portion of the channel region by a first insulation layer; and a conductive control gate formed substantially over but electrically isolated from the floating gate and formed over the entire channel region; along with a method for fabricating such is provided.

8 Claims, 5 Drawing Sheets

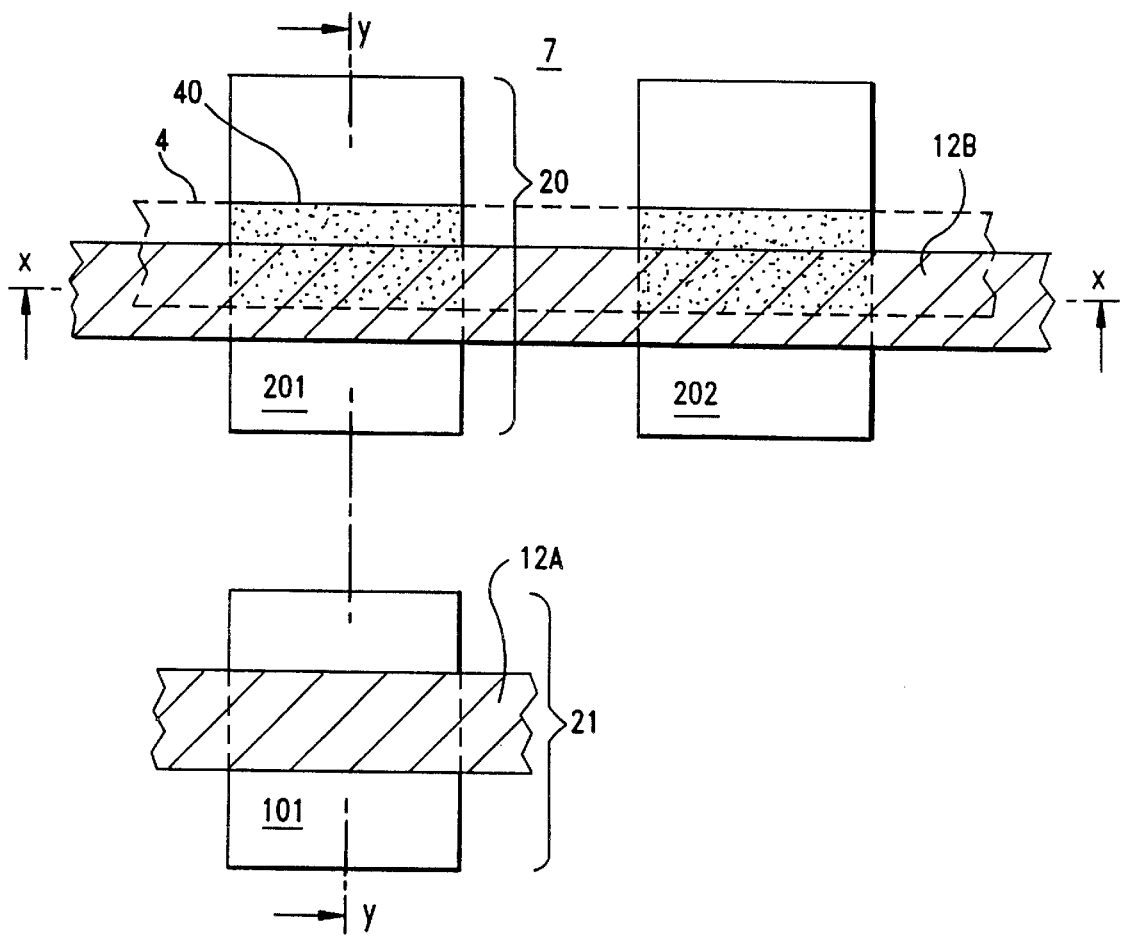
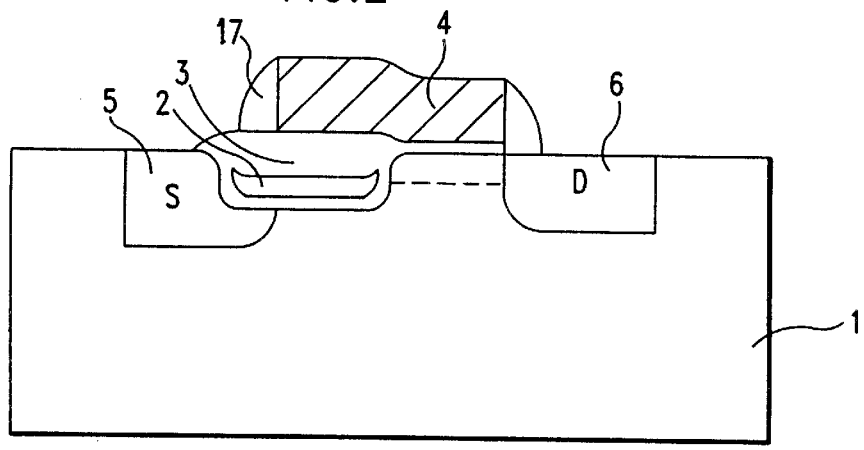

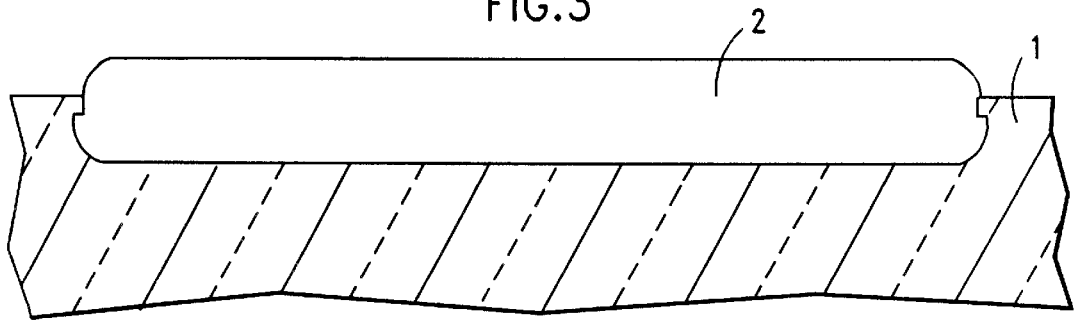
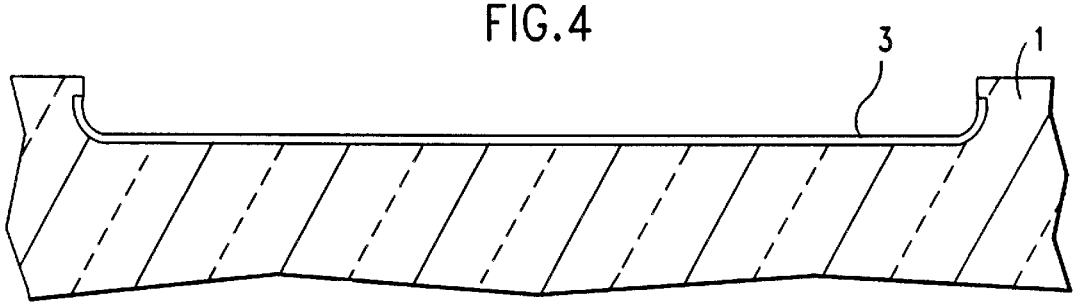
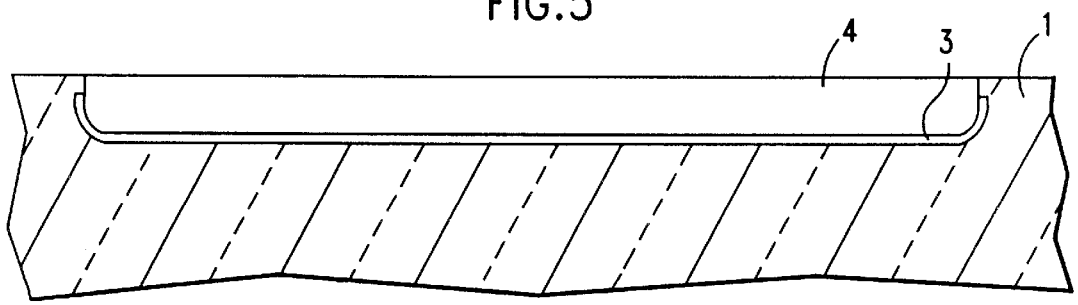
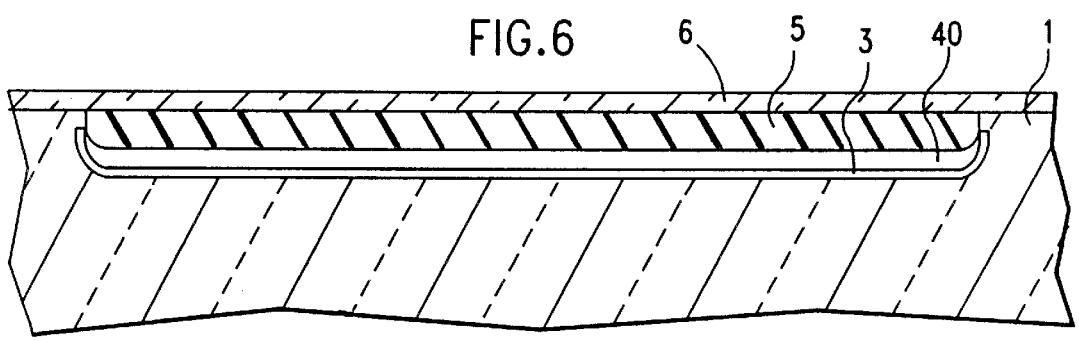

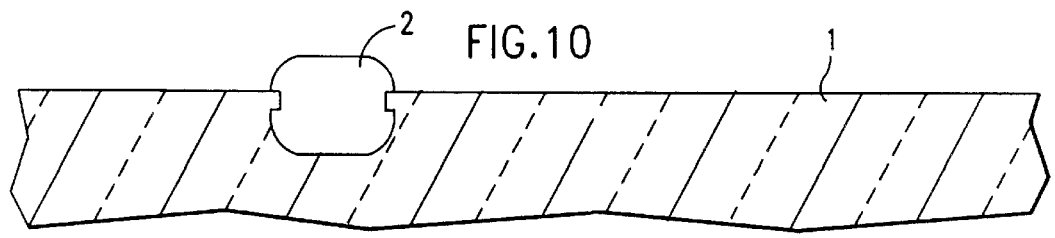
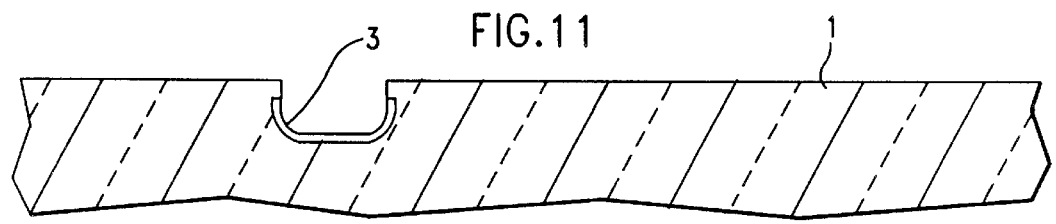
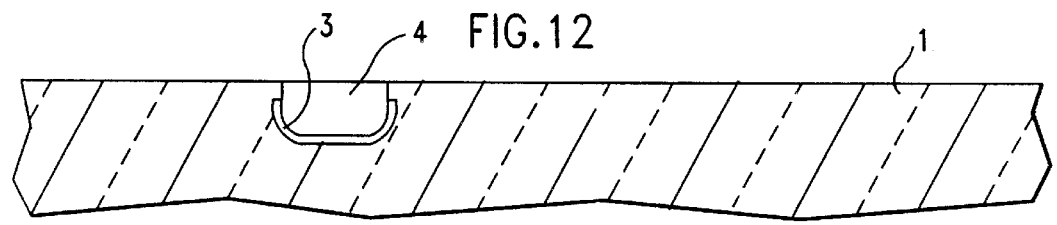
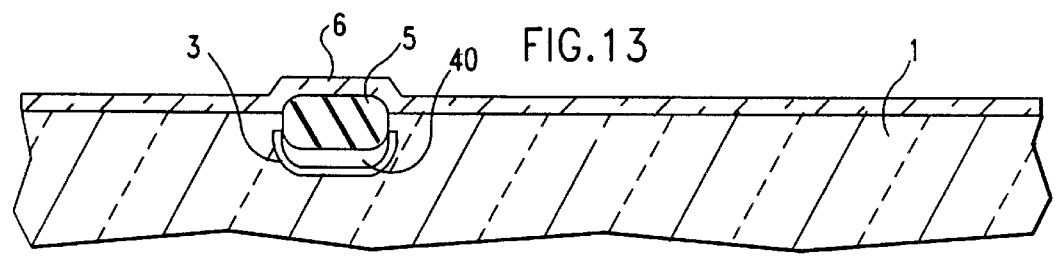
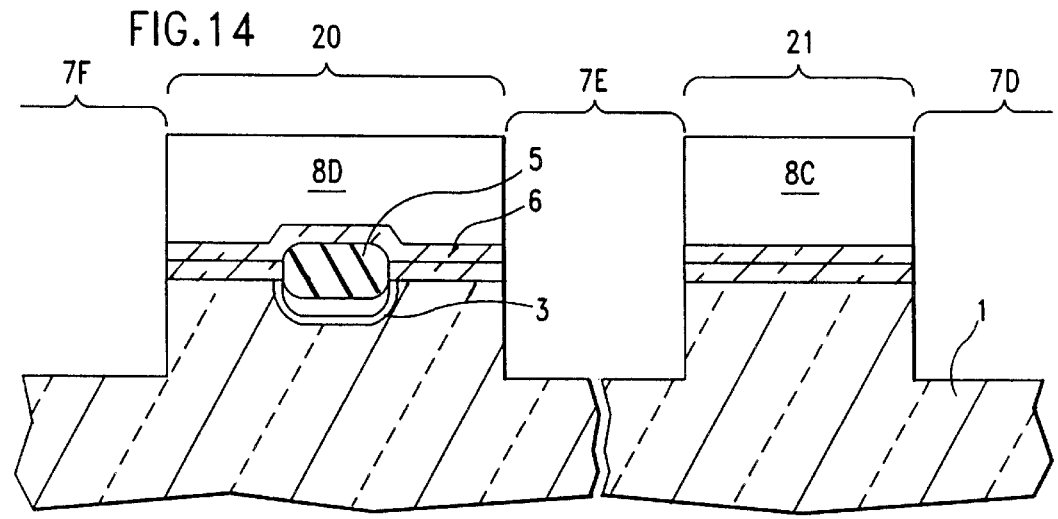

FIELD EFFECT TRANSISTOR HAVING A FLOATING GATE

TECHNICAL FIELD

The present invention is concerned with a field effect transistor (FET) having a floating gate and especially flash memory cell structures exhibiting high programming efficiency. Furthermore, the present invention is concerned with a process for fabricating the FET structure of the present invention, and is especially concerned with a process for creating a split gate flash memory cell wherein the floating gate is recessed into the silicon substrate.

BACKGROUND OF INVENTION

Field effect transistors (FETs) employing a so-called "floating gate" along with a control gate are well known. The floating gate differs from a control gate in that it has no direct electrical connection to any external component and is surrounded by isolation on all sides. The presence of the control gate enables the device to function as a regular FET, while the floating gate collects and stores injected electrons or holes. The floating gate provides a method for changing the threshold voltage needed to pass a charge from the source to the drain. The presence of the control gate adds control to the injection of charges into and out of the floating gate, and thus enables the device to function as an electrically reprogrammable memory device.

Source-side injection flash cells or split gate flash cells are commonly used as embedded flash memories. In a split gate cell, the floating gate overlies only a portion of the channel and the control gate overlies both the floating gate and the remainder of the channel. In other words, there are two transistors in series between a source and a drain. One relatively popular flash cell employs oxidized polysilicon to create sharp points in the polysilicon in order to enhance the electric field. This in turn allows erasure at lower voltages and provides for thicker dielectric layers between the floating gate and the control gate. The commonly used process for fabricating such cells is referred to as localized oxidation of silicon (LOCOS) process over the floating gate polysilicon to form an insulator cap along with sharp points on the floating gate. The LOCOS process results in bird's beak creating the sharp points.

Nevertheless, the existing flash memory cells exhibit two major shortcomings which are high programming voltage required and non-planar cell topography due to the presence of the floating gate.

In order to inject electrons into the floating gate, either by hot electron or electron tunnelling (Fowler-Nordheim or F-N tunnelling), a high vertical electrical field must be induced. For instance, typically more than about 10 volts of voltage difference is needed between the control gate and source, drain or substrate. For example, with a prior art configuration utilizing source-side hot electron injection, the required programming voltage is 10 V. This split gate flash memory cell as shown in FIG. 1 has a floating gate on top of the silicon surface that is typical of most of the conventional structures. However, incorporating this technology into a logic application presents problems for metallization due to the topography, especially when wiring dimensions become less than 0.25 microns. Lithographic patterning and reactive ion metal etching both are quite difficult to perform on a non-planar gate surface.

SUMMARY OF INVENTION

The present invention is concerned with a new FET structure that addresses problems in the prior art concerning the cell topography and high programming voltage requirements. According to the present invention, a new structure is provided whereby the floating gate is recessed into the semiconductor substrate. The top of the floating gate is planar with or recessed with respect to the original semiconductor surface.

More particularly, the present invention is concerned with a field effect transistor which comprises a semiconductor substrate that comprises a first doped source region and a second doped drain region separated by a channel region. A conductive floating gate is formed over a first portion of the channel region adjacent to the first doped source region and recessed into the semiconductor substrate and being separated from the first portion of the channel region by a first insulation layer. A conductive control gate is formed substantially over but electrically isolated from the floating gate and is formed over essentially the entire channel region including that portion not located beneath the floating gate. In addition, the present invention is concerned with a process for fabricating the above-described field effect transistor. In particular, the above-described field effect transistor can be fabricated by forming a recess in a semiconductor substrate and providing a floating gate insulating layer on the surface of the recess. Polycrystalline silicon is then deposited in the recess and oxidized leaving a portion of its lower area unoxidized to serve as the floating gate. Shallow trench isolation is then formed. Control gate isolation, control gate, and source and drain regions are provided.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWINGS

FIG. 1 is a top view of memory cell in accordance with the present invention along with a conventional FET device.

FIG. 2 is a schematic diagram of a split gate arrangement in accordance with the present invention.

FIGS. 3–9 are cross-sectional views of the device in various stages of fabrication according to the present invention and shown in the X—X direction.

FIGS. 10–17 are cross-section views illustrating the device in various stages of fabrication according to the present invention and shown along the Y—Y vertical direction.

BEST AND VARIOUS MODES FOR CARRYING OUT INVENTION

Figure 7:
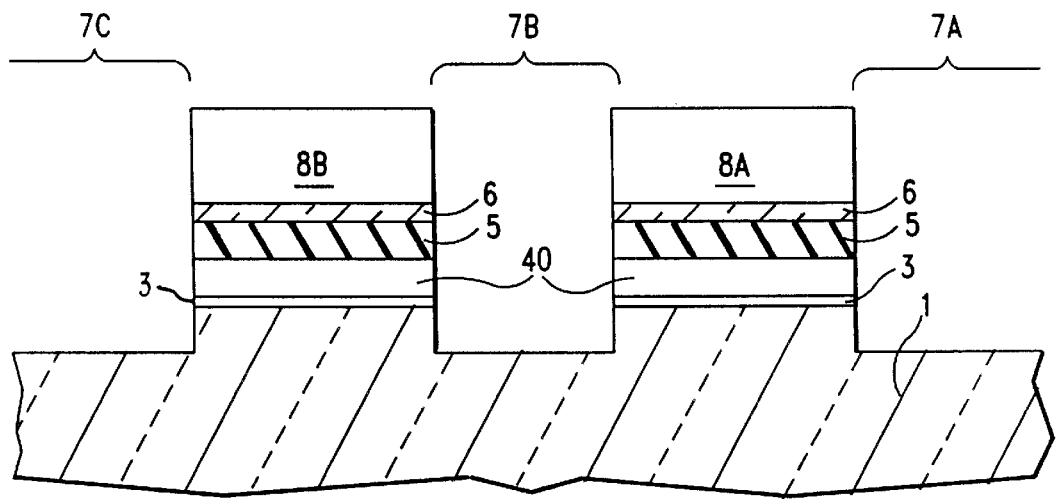

Reference to the figures will facilitate an understanding of the present invention.

FIG. 1 schematically illustrates a top view of flash memory cells 201 and 202 in accordance with the present invention along with a conventional FET device 101. FIG. 2 is a schematic diagram of a split gate arrangement in accordance with the present invention. In FIG. 2, numeral 1 represents the semiconductor substrate, numeral 2 illustrates the floating gate recessed into the substrate 1, numeral 3 represents the gate isolation for both the floating gate 2 and control gate 4, and numeral 17 represents sidewall isolation for the control gate. Numerals 5 and 6 represent source and drain regions respectively.

According to the present invention, recessed oxidation can be carried out by forming a layer of thermal oxide 2 on semiconductor substrate 1 (see FIGS. 3 and 10) using a mask such as a silicon nitride mask (not shown). The semiconductor substrate is typically silicon but can be any other semiconductor material such as group III–V semiconductor. The recessed oxidation can be carried out by thermal oxidation of substrate 1 to provide a silicon oxide layer which is typically about 500 to about 3000 Å thick, and more typically about 1000 to about 2500 Å thick. Employing thermal oxidation creates a recess structure with only minimal damage to the underlying semiconductor substrate 1. The thermally grown oxide 2 is then removed by etching in a suitable etchant composition such as a buffered HF composition. Next, a gate insulator 3 (see FIGS. 4 and 11) is provided within the recess. This layer 3 can be grown in the recess by thermal oxidation or can be provided by deposition techniques such as chemical vapor deposition (CVD) or physical vapor deposition (PVD). Typically, layer 3 is about 10 to about 40 Å thick, and more typically about 20 to about 35 Å thick and acts as the floating gate insulator.

A conductive material 4 such as doped polycrystalline silicon is provided on the insulating layer 3. After deposition, the polycrystalline silicon layer is polished such as using chemical-mechanical polishing and the structure is planarized so that the polysilicon 4 remains only in the recess and its top is coplanar with the top of substrate 1. (See FIGS. 5 and 12). The polysilicon is then oxidized to provide oxide 5 such as by thermal oxidation in an oxygen atmosphere typically at temperatures of about 800° C. to about 1050° C. At least about 250 Å to about 500 Å at the lower portion of the polysilicon should not be oxidized and typically about 300 Å to about 1500 Å is left unoxidized. This portion is designated as 40 in FIGS. 6 and 13. Polysilicon portion 40 will serve as the floating gate.

A layer of silicon nitride 6 can be blanket deposited such as employing chemical vapor deposition. Nitride layer 6 serves as a polish stop layer for subsequent steps in forming shallow trench isolation.

Figure 8:
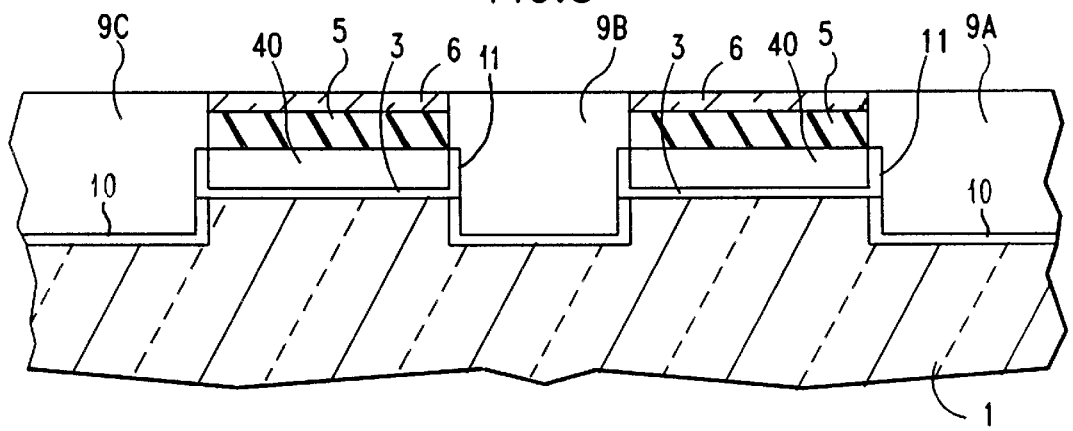
Figure 9:
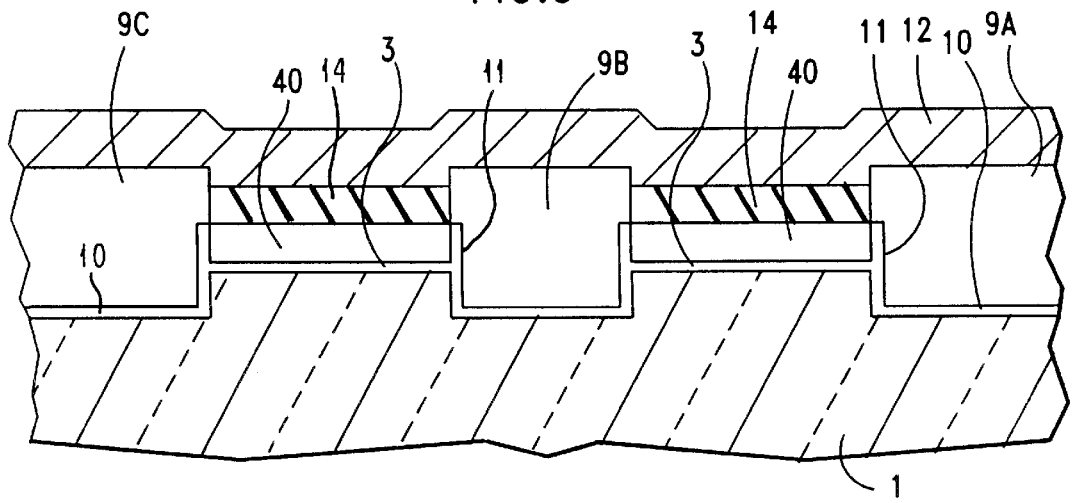
Figure 15:
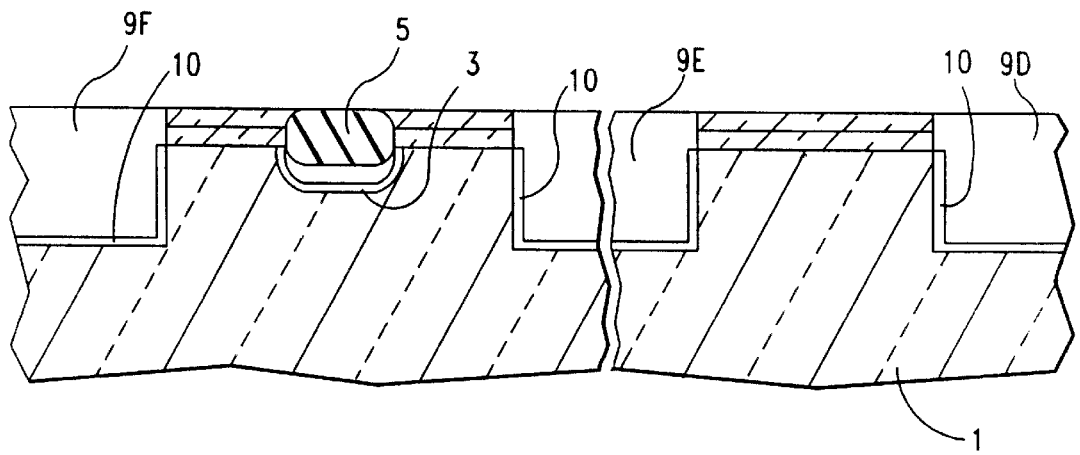

The active areas of the structure can now be defined employing conventional photolithographic techniques such as by applying a photoresist material 8 and then patterning it to provide the desired structure. The pattern photoresist 8B and 8A in FIGS. 7 and 8D and 8C in FIG. 14 then acts as a mask for removing exposed portions of underlying nitride layer 6, then exposed portions of underlying isolation oxide layer 5, polysilicon layer 40, floating gate isolation layer 3 and into the semiconductor substrate 1 to the desired depth. See FIGS. 7 and 14. The nitride layer can be removed by reactive ion etching. Likewise, the oxide layer 5 can be removed using reactive ion etching. The polysilicon portions can also be removed by well known reactive ion etching techniques. Also, the underlying gate oxide layer 3 and silicon substrate can be removed by reactive ion etching as well known in the art. Next, the photoresist remaining is removed by for instance dissolving in a suitable solvent. The shallow trenches 7A, 7B and 7C in FIGS. 7 and 7E, 7F and 7G in FIG. 14 created in the substrate are typically about 500 Å to about 3000 Å deep and more typically about 1000 Å to about 2500 Å deep. The sidewalls 11 of the polysilicon 40 and walls 10 of the silicon substrate are then oxidized employing thermal oxidation. See FIGS. 8 and 15. Typically, the thickness of the layers 11 and 10 is about 30 Å to about 200 Å and more typically about 50 Å to about 150 Å. Oxidation of the sidewalls is important for purposes of passivation in order to prevent charge leaking from the floating gates.

The shallow trench isolation can be formed by chemical vapor deposition of tetraethoxysilane (TEOS) and reaction of the TEOS with oxygen or ozone to provide silicon oxide fill. The structure can then be planarized such as employing chemical mechanical polishing (CMP) whereby the nitride layer 6 acts as a polish stop. The planarized structure with the shallow trench isolations 9A, 9B and 9C are illustrated in FIGS. 8 and 9D, 9E and 9F shown in FIG. 15.

Figure 16:
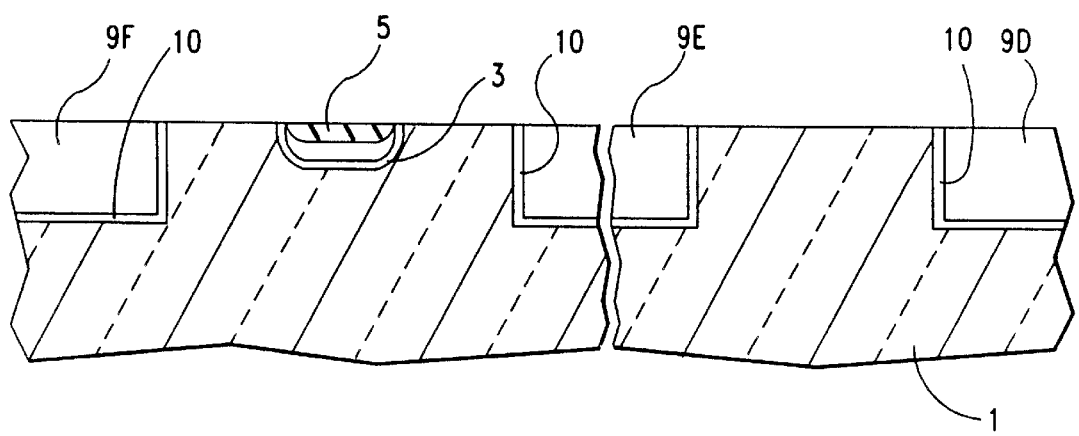

The nitride layers 1 and 6 are removed such as using reactive ion etching or more commonly with hot phosphoric acid. See FIG. 16.

Figure 17:
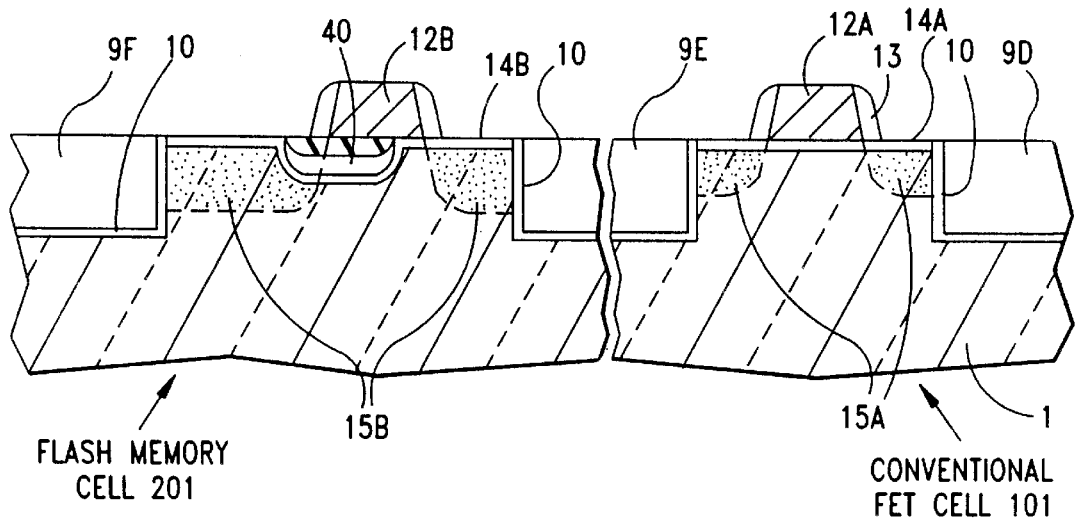

Gate oxide 14 is then provided over the substrate such as by thermal oxidation (see FIG. 17). Typically the gate oxide is about 25 Å to about 150 Å thick, and more typically about 30 Å to about 80 Å thick. The oxide grown in the shallow trench as well as on top of the floating gate are also recessed so that the final surface is fully planarized. Moreover, if necessary as illustrated in FIG. 17 to provide gate oxide for the flash cell and for convention FET of different thicknesses, a separated gate oxide formation may be employed as well known to those skilled in the art. As shown in FIG. 17, the gate oxide for the flash memory cell is designated as 14B and that for the conventional FET is 14A. Moreover, as is well known in the art, the gate oxide for the flash memory cell can be formed by a thermal oxidation sometimes referred to as a localized oxidation of silicon (LOCOS) in order to provide sharp edges between the floating gate and the control gate to facilitate erasure. Due to this thermal oxidation process the top of the floating gate will be concave and recessed with respect to the original top surface of the semiconductor substrate. In the preferred aspects of the present invention, the floating gate will exhibit the sharp points at the edges to enhance the electric field. The polysilicon for control gate 12B and conventional FET gate 12A can be deposited and defined by techniques well known in the art. Next, source and drain region 15B and 15A can be provided, for example by implanting source dopant ions at sufficient energy to penetrate the floating gate into the silicon substrate. Sidewall isolation can be provided on the gates 12B and 12A by thermal oxidation of the polysilicon material employing well known techniques, and/or by deposition and directional etching of a suitable insulating material—e.g., silicon nitride or silicon dioxide. Also, the structure can then be completed by providing the necessary metallization.

The programming conditions for a device of the present invention are: 1) for the selected Bit Line, Vs=5 V, Vw=1.8 V and Vbl=0 V, 2) for the non-selected Bit Line, Vbl=1.8 V. The electrons are coming from the inversion layer connected to the drain and inject directly into floating gate.

During Read, electrons flow in the opposite direction, so as to avoid any unintentional programming. The read condition is: Vs=0 V, Vw=1.8 V and Vbl=1.8 V.

The erase mechanism is FN tunneling whereby electrons are moved from the floating gate to the word line (or control gate). Field enhancement along the sharp edges of the floating gate results in high erase efficiency. The erase condition is: Vs=0 V, Vw=14 V and Vbl=0 V.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A field effect transistor which comprises:

a semiconductor substrate comprising a first doped source region and a second doped drain region separated by a channel region;

a conductive floating gate formed over a first portion of said channel region adjacent to said first doped source region, and recessed into said semiconductor substrate and being separated from said first portion of said channel region by a first insulation layer;

and a conductive control gate formed substantially over but electrically isolated from said floating gate and formed over the entire channel region including those portions not beneath said floating gate; and wherein gate oxide located on top of said floating gate is recessed into said semiconductor substrate.

2. The field effect transistor of claim 1 wherein said semiconductor substrate is silicon.

3. The field effect transistor of claim 1 wherein said floating gate and said conductive control gate are of polycrystalline silicon.

4. The field effect transistor of claim 1 wherein said floating gate has pointy edges.

5. The field effect transistor of claim 1 which further includes shallow trench isolation.

6. The field effect transistor of claim 1 herein said shallow trench isolation is self aligned to the active areas of said field effect transistor.

7. The field effect transistor of claim 1 wherein the sidewalls of said floating gate contain silicon oxide passivation layer.

8. The field effect transistor of claim 1 wherein said shallow trench isolation is from tetraethylorthoxysilane reacted with oxygen or ozone.

* * * * *

UNITED STATES PATENT AND TRADEMARK OFFICE
CERTIFICATE OF CORRECTION

PATENT NO. : 6,097,056

DATED : August 1, 2000

INVENTOR(S) : Louis Lu-Chen Hsu et al.

It is certified that error appears in the above-identified patent and that said Letters Patent is hereby corrected as shown below:

Column 6, line 15, change "1 herein" to --5 wherein--

Signed and Sealed this

Twenty-fourth Day of April, 2001

Attest:

NICHOLAS P. GODICI

Attesting Officer

Acting Director of the United States Patent and Trademark Office